United States Patent [19]
Suzuki

[11] Patent Number: 5,659,553
[45] Date of Patent: Aug. 19, 1997

[54] COMPARISON CIRCUIT FOR COMPARING SEMICONDUCTOR DEVICE OUTPUT BY STROBE SIGNAL TIMING

[75] Inventor: Masayuki Suzuki, Hanyu, Japan

[73] Assignee: Advantest Corporation, Tokyo, Japan

[21] Appl. No.: 532,421

[22] Filed: Sep. 22, 1995

[30] Foreign Application Priority Data

Sep. 22, 1994 [JP] Japan .................................. 6-254356

[51] Int. Cl.$^6$ .................................. G01R 31/28
[52] U.S. Cl. .................................. 371/25.1; 340/146.2
[58] Field of Search .................................. 371/25.1, 20.4, 371/21.2, 21.3, 24, 67.1; 324/73 R, 73 AT; 340/146.2

[56] References Cited

U.S. PATENT DOCUMENTS 4,635,256  1/1987  Herlein .................................. 371/1
5,365,527  11/1994  Honma .................................. 371/25.1

*Primary Examiner*—Hoa I. Nguyen
*Attorney, Agent, or Firm*—Knobbe, Martens, Olson & Bear LLP

[57] ABSTRACT

This present invention provides a comparison circuit where the close limitation of the strobe timing is modified and the setting margin of the strobe timing is increased for semiconductor testing apparatuses. The comparison circuit is comprised of the decoder (301) to create the expected value signal (EXP) of the pattern generator 2 by decoding the HIGH and LOW level open signal, a circuit (403) which consists of a first interleave reading circuit and an interleave counter and which is made to inhibited its reading by the said open signals, a circuit (404) which consists of a second interleave reading circuit and an interleave counter and which is made to inhibited its reading by the said open signals, a first mask gate (408) which the output signal of the circuit (403), consisting of an interleave reading circuit and an interleave counter, and the said signal enter, and a second mask gate (409) which the output signal of the circuit (404), consisting of an interleave reading circuit and an interleave counter, and the said open signal enter.

11 Claims, 8 Drawing Sheets

EXP —X— H —X— L —X— H —X— H —X— Z —X— L —X— Z —X—

FIG. 6A
*(PRIOR ART)*

DUT OUTPUT —X— OUT1 —X— OUT2 —X— OUT3 —X— OUT4 —X— OUT5 —X— OUT6 —X— OUT7 —X—

FIG. 6B
*(PRIOR ART)*

STBH

THX

FIG. 6C
*(PRIOR ART)*

STBL

FIG. 6D
*(PRIOR ART)*

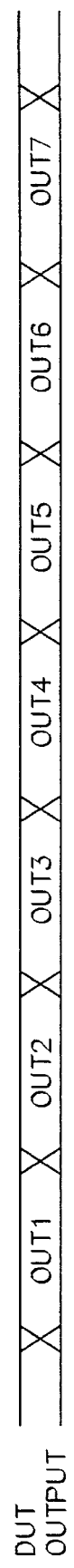
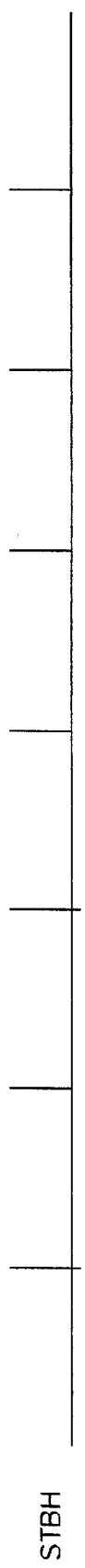
FIG. 7A
FIG. 7B
FIG. 7C
FIG. 7D 5,659,553

1

COMPARISON CIRCUIT FOR COMPARING SEMICONDUCTOR DEVICE OUTPUT BY STROBE SIGNAL TIMING

BACKGROUND OF THE INVENTION

This present invention relates to a comparison circuit for a semiconductor testing apparatus for testing a semiconductor device, and more particularly, to a comparison circuit which compares an output from a device under test with an expected signal at a timing of strobe signal with larger margin and flexibility in setting the strobe timing.

Semiconductor device tests by a semiconductor testing apparatus includes a GO/NO-GO (pass/fail) test of an output from a device under test (hereinafter referred to as DUT) by a timing of a strobe signal.

FIG. 4 shows an example of block diagram of a conventional comparison circuit used in a semiconductor testing apparatus to perform the GO/NO-GO test by the timing of the strobe signal.

In FIG. 4, level (analog) comparators (5, 6) compare the output signal of DUT 1 with reference voltage signals. The level comparator 5 compares the DUT's output signal with a high voltage reference signal (VOH) for detecting a high level of the output signal and generates an output signal SH when the output signal from the DUT reaches the reference voltage VOH. The level comparator 6 compares the DUT's output signal with a low voltage reference signal (VOL) for detecting a low level of the output signal and generates an output signal SL when the output signal from the DUT reaches the reference voltage VOL. The output signals SE and SL are given to a digital comparison circuit 4.

A timing generator 3 generates strobe signals (STBH, STBL) for executing logical comparison in the digital comparison circuit 4. The strobe signals STBH and STBL are given to the digital comparison circuit 4 to determine the timing of the comparison. In the timing generator 3, the strobe signals STBE and STBL are generated on the basis of timing data stored in a memory 31. A pattern generator 2 sends a control signal (TEST) to the memory 31 to read the timing data from the memory 31.

The pattern generator 2 also sends an expected value signal (EXP) which periodically varies its high/low logic state and a system clock (SCLK) to the digital comparison circuit 4. The system clock is used as a time reference of overall operation of the semiconductor testing apparatus.

The digital comparison circuit 4 compares the logic states of the output signals SH and SL from the level comparators 5 and 6 with the expected value signals at the timings of the strobe signals STBH and STBL and outputs comparison results (COR). In a semiconductor testing apparatus, it is usually desired that such comparison results be taken out in synchronism with the system clock SCLK because, for example, of convenience in signal processes at later stages of the testing apparatus. Further, since the timings of the strobe signals vary depending on the timing data from the memory 31, phases of the strobe signals STBH and STBL are usually different from those of the system clock. Thus, the comparison circuit includes a circuit arrangement for sampling (latching) the output signals SH and SL by the timings of the strobe signals and re-timing comparison results between the sampled output signals and the expected value signals to be synchronized with the system clock SCLK.

FIG. 5 shows the configuration of the conventional digital comparison circuit 4. As shown in FIG. 5, the output signal

2

SH from the level comparator 5 is latched by a buffer 42 at the timing of the strobe signal STBE and stored in a flip-flop 43 at the timing of the strobe signal through a delay element 45. The output signal SL from the level comparator 6 is latched by a buffer 46 at the timing of the strobe signal STBL and stored in a flip-flop 47 at the timing of the strobe signal through a delay element 49. The data in the flip-flops 43 and 47 are respectively provided to interleave writing circuits 44 and 48 wherein the data is written therein in a time divisional manner. The data in the interleave writing circuits 44 and 48 and then read out by interleave reading circuits 33 and 34 and compared with the expected value signals by a logic comparator 41. The expected value signals are in synchronism with the system clock SCLK.

An example of interleave circuit is shown in FIG. 8. The example of FIG. 8 includes both an interleave writing circuit and an interleave reading circuit. The interleave writing circuits 44 and 48 correspond to the left side of FIG. 8 and the interleave reading circuits 33 and 34 correspond to the right side of FIG. 8. Each of the interleave writing circuits 44 and 48 includes an input flip-flop 60, a plurality of multiplexers $51_1$–$51_4$, a counter 52 and a plurality of flip-flops $54_1$–$54_4$. The strobe signal is provided to the counter 52 and the flip-flops $54_1$–$54_4$. Thus, every time the counter 52 receives the strobe signal, a control signal from the counter 52 sequentially selects one of the multiplexers $51_1$–$51_4$. As a result, the incoming data through the flip-flop 60 is sequentially divided in the flip-flops $54_1$–$54_4$ in synchronism with the strobe signal. In other words, the interleave writing circuit in FIG. 8 functions as a serial-parallel converter by the timing of the strobe signals.

Each of the interleave reading circuits 33 and 34 includes a counter 56, a multiplexer 58 and an output flip-flop 62. The counter 56 and the output flip-flop 62 are provided with the system clock. A control signal from the counter 56 is provided to the multiplexer 58. Thus, every time the counter 56 receives the system clock, the multiplexer sequentially selects the data from one of the flip-flops $54_1$–$54_4$ and the data is taken out through the output flip-flop 62 in a serial form in synchronism with the system clock. In other words, the interleave reading circuit in FIG. 8 functions as a parallel-serial converter by the timing of the system clock.

By the procedure described above, the output signals SH and SL from the level comparators 5 and 6 which are latched by the timing of the strobe signals are timing adjusted to synchronize with the system clock. Since the system clock SCLK and the strobe signals STBH and STBL are used to sequentially drive the interleave circuit, both of the strobe signals and the system clock must be constantly applied to the interleave circuit so as to keep the sequence of data in the circuit in order.

FIG. 6 shows the timing chart involving the strobe signal in the conventional comparison circuit. OUT1, OUT2, OUT3 . . . OUT7 shown in FIG. 6B which are output signals of DUT are applied to a digital comparison circuit 4. The expected value signal levels corresponding to the output signals are H, L, H . . . Z, respectively, in FIG. 6A. The strobe signal STBH for a high level and the strobe signal STBL for a low level are applied to the comparison circuit as shown in FIGS. 6C and 6D.

As described above, the interleave operation requires continuous application of the strobe signals STBH and STBL to the interleave circuit. For example, the strobe signal STBH for the high level must be output even for an expected value signal is in the low level as in the situations of OUT2 or OUT6. In such situations, the strobe signal STBE is unnecessary as far as the logical comparison is concerned since the expected value only requires the low level output. Similarly, the strobe signal STBL for the low level must be output even for an expected value signal is in the high level as in the situations of OUT1, OUT3 or OUT4. Although not shown in the timing chart, some test cycles do not need to compare the device output and the expected value at all, which is usually called a "don't care" situation. Even in such a situation, the strobe signal must be supplied to the interleave circuit to maintain the sequential order in the circuit. In FIG. 6A, a reference "Z" in the expected value means high impedance condition in the output of the device under test which requires both strobe signals STBH and STBL for its evaluation.

As noted above, the timings of the strobe signals are variable in the testing apparatus so that the phases of the strobe signals change within the test cycle. Generally, a strobe interval, i.e., a time difference between the adjacent strobe signals, has a limitation called a close limitation. That is, an available minimum strobe interval corresponds to the maximum logic operating rate of the timing generator and digital comparison circuit. Therefore, as increasing the operating rate of the testing apparatus, the available range of the strobe interval necessarily becomes shorter. Further, if the operating rate of the testing apparatus is set to a maximum, the strobe timing results to be limited to the minimum interval of the operating rate.

In the conventional comparison circuit for a semiconductor testing apparatus has a disadvantage in that the strobe signal must be supplied to the comparison circuit even it is unnecessary in the comparison purpose and the timing between the strobe signals tend to be limited to the close limitation.

SUMMARY OF THE INVENTION

It is an object of the present invention to provide a comparison circuit for a semiconductor testing apparatus which is capable of solving the above-mentioned disadvantage associated with the close limitation.

According to the present invention, an open circuit to inhibit the generation of the strobe signals so as to realize a flexible setting of the strobe signal timings which will ease the close limitation problem.

The comparison circuit of the present invention includes a decoder which creates a strobe open signal by decoding an expected value signal for prohibiting the strobe signal to be supplied to the comparison circuit, an interleave circuit which consists of a writing circuit and a reading circuit wherein the writing circuit is operated by the timing of the strobe signal and the reading circuit is operated by the timing of a system clock.

an interleave counter provided in the reading circuit of the interleave circuit which inhibits a reading operation of the reading circuit when receiving the strobe open signal generated by the decoder, a digital comparison circuit to compare the output signal from the interleave circuit with the expected value data to generate a comparison result, a mask gate controlled by the strobe open signal to mask the output signal of the interleave circuit passing therethrough so that a digital comparison operation in the digital comparison circuit is ineffective.

According to the present invention, the present invention has significantly relaxed the problem involving the close limitation. Further, when a comparison is not required, the comparison circuit of the present invention generates the strobe open signal which inhibits the logic comparison circuit to perform the operation during the corresponding test cycle.

Accordingly, the present invention provides a comparison circuit to be used in a semiconductor testing apparatus which compares an output from a device under test with an expected value signal at a timing of strobe signal with larger margin and range in setting the timings of the strobe signal.

BRIEF DESCRIPTION OF THE DRAWINGS

FIG. 6 shows a timing chart involving the strobe signals in the conventional comparison circuit.

FIG. 7 shows a timing chart involving the strobe signals in the comparison circuit of the present invention.

DESCRIPTION OF THE PREFERRED EMBODIMENTS

Figure 1:
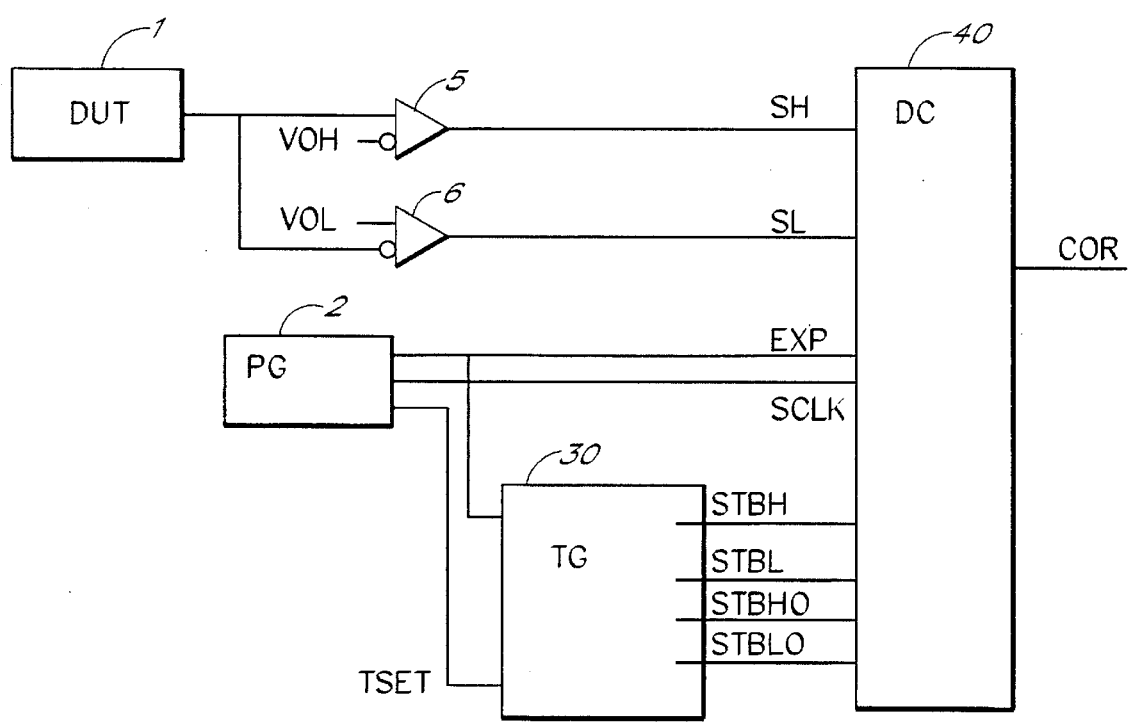
FIG. 1 is a block diagram of the comparison circuit for the semiconductor testing apparatus in accordance with the present invention.

Referring to the drawings, an embodiment of the present invention will be described.

FIG. 1 shows the embodiment of this invention and a block diagram of the comparison circuit for the semiconductor testing apparatus. In the embodiment of the present invention, it is provided with a circuit which inhibits a strobe signal in each test cycle when the strobe signal is not to be used for logic comparison purpose.

As shown in FIG. 1, a timing generator 30 provides a strobe high level open signal STBHO and a strobe low level open signal STBLO to a digital comparison circuit 40. These strobe open signals are used for prohibiting each strobe signal to be applied to the interleave circuit and holding the operation of the interleave circuit.

Figure 2:
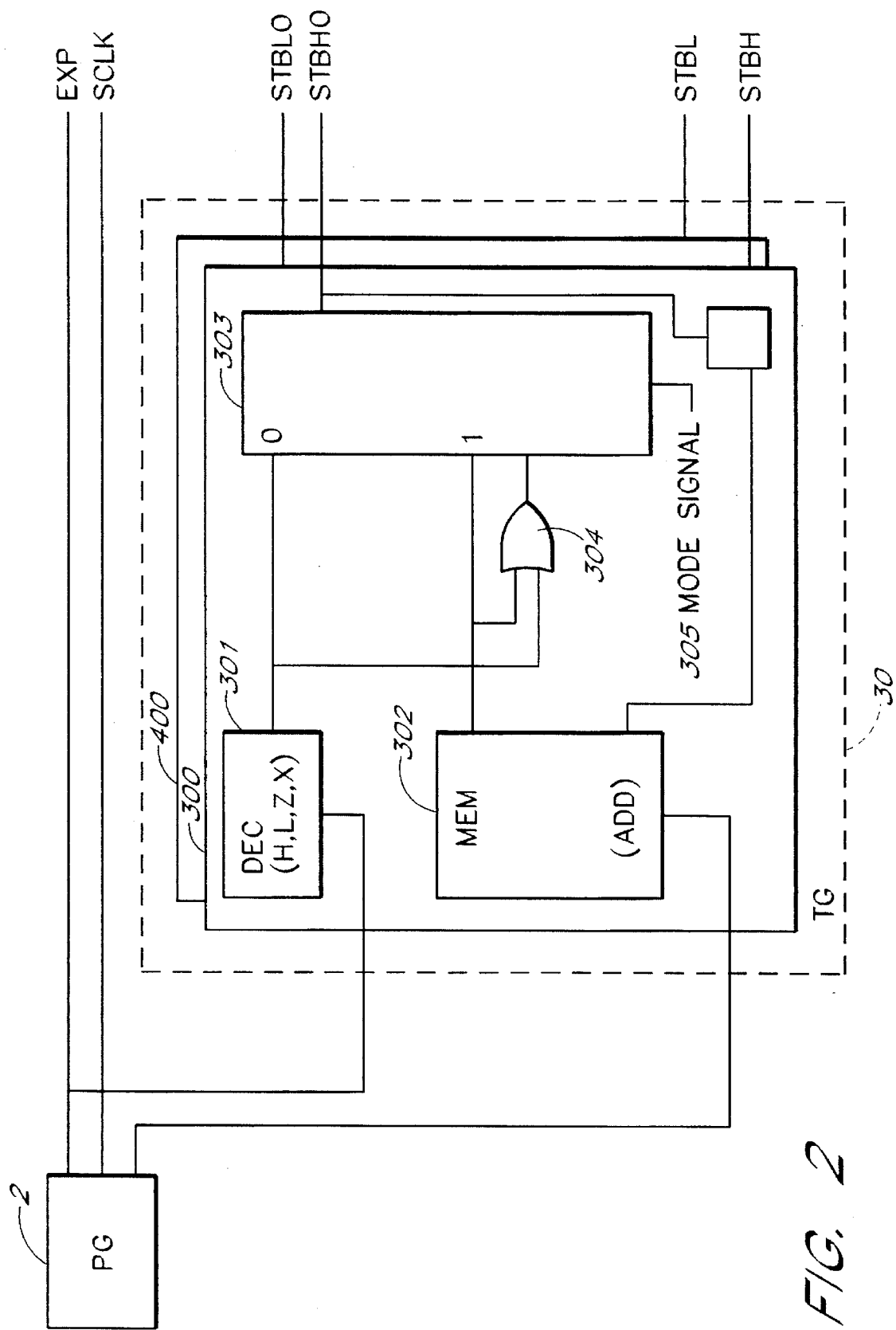
FIG. 2 shows an example of circuit configuration of the timing generator.

FIG. 2 shows an example of circuit configuration of the time generator 30. As shown in FIG. 2, the timing generator 30 has a decoder 301 which is provided with an expected value signal EXP. The decoder 301 decodes the expected value signal EXP and generates the strobe open signals STBHO and STBLO which inhibit the strobe signals from supplying to the comparison circuit.

Generally, in a semiconductor testing, if the expected value is high, it is possible to sufficiently determine GO/NO-GO for the output signal from the device under test only by the strobe signal STBH for the high level. If the expected value is LOW, it is possible to successfully determine GO/NO-GO for the output signal from the device under test only by the strobe signal STBL for the low level. Similarly, if the expected value is "X" (don't care), the comparison is not performed at all and both of the high and low strobe signals STBH and STBL become unnecessary. If the expected value is in a high impedance condition Z, both of the strobe signals STBH and STBL become necessary.

Namely, the decoder 301 decodes the expected value signal EXP and generates a corresponding signal according to the following decoding conditions:

(1) When the expected value is high level H, the strobe signal for the low level STBL should be prohibited.

(B) When the expected value is low level L, the strobe signal for the high level should be prohibited.

(C) When the expected value is "don't care" X, both of the strobe signals STBH and STBL should be prohibited.

(D) When the expected value is "high impedance" Z, none of the strobe signals STBH and STBL should be prohibited.

The timing generator 30 further includes a memory 302, a selector 303, an OR circuit 304 and an inhibit circuit. When the strobe open signal STBHO or STBLO is generated by the decoder 301, the strobe open signal is provided to the inhibit circuit 307 through the selector 303. Thus, the strobe signal STBH or STBL is prohibited from coming out from the timing generator 30. It is also possible to store the data which can generate the strobe open signals in the memory 302 and provided the strobe open signals through the selector 303. In such a situation, the selector is switched from the strobe open signals from the decoder 301 provided at a terminal 1 to the strobe open signals from the memory 302 provided at a terminal 2 by a mode signal 305 given at a terminal S of the selector 303. It is also possible to provide an OR signal of the signal from the decoder 301 and the signal from the memory 302 through the OR circuit 304 and the selector 303.

Preferably, the timing generator 30 is configured with a high level strobe decoding part 300 and a low level strobe decoding part 400 separately. Such a configuration provides the automatic setting of the strobe open (inhibit) signal.

Figure 3:
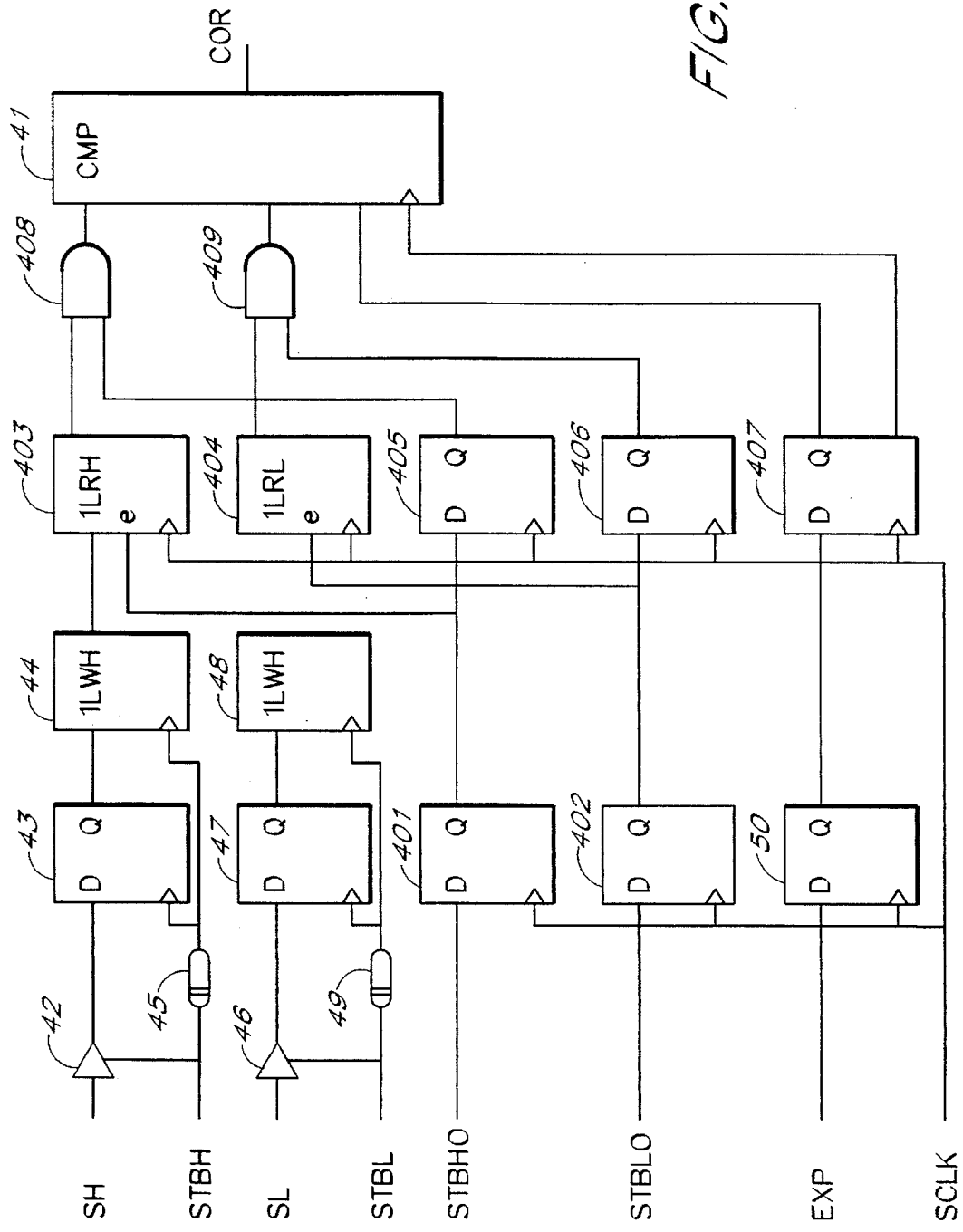
FIG. 3 shows an example of circuit configuration of the digital comparison circuit to be used in the present invention.
Figure 4:
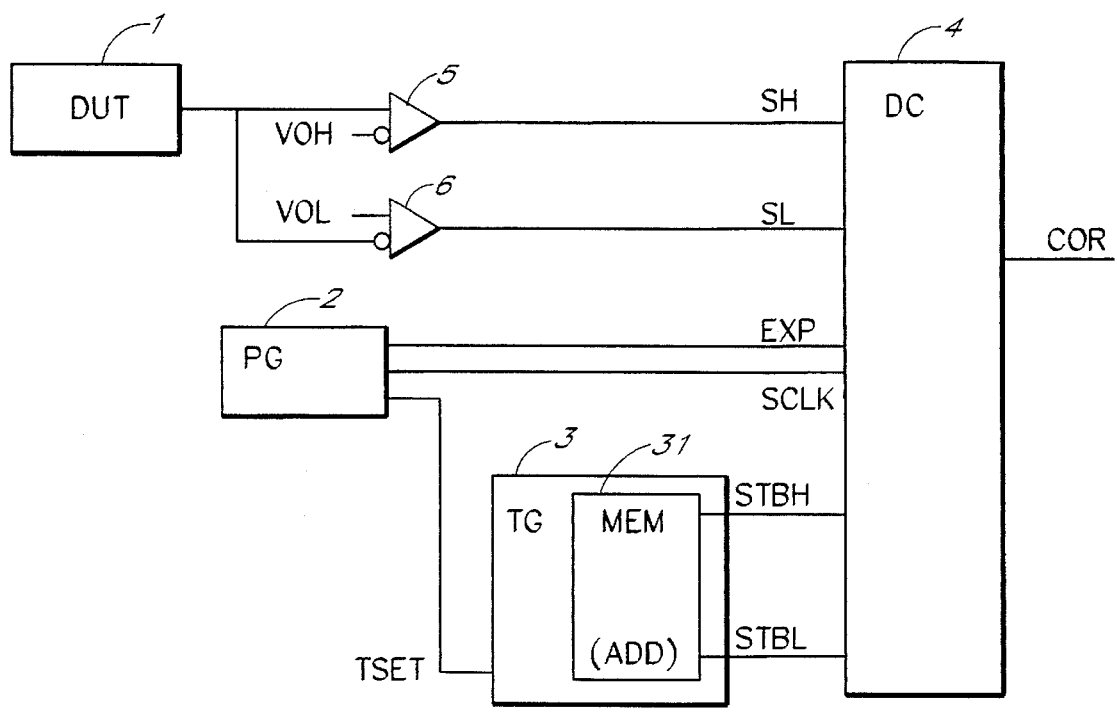
FIG. 4 is a block diagram showing an example of conventional comparison circuit for a semiconductor testing apparatus.
Figure 5:
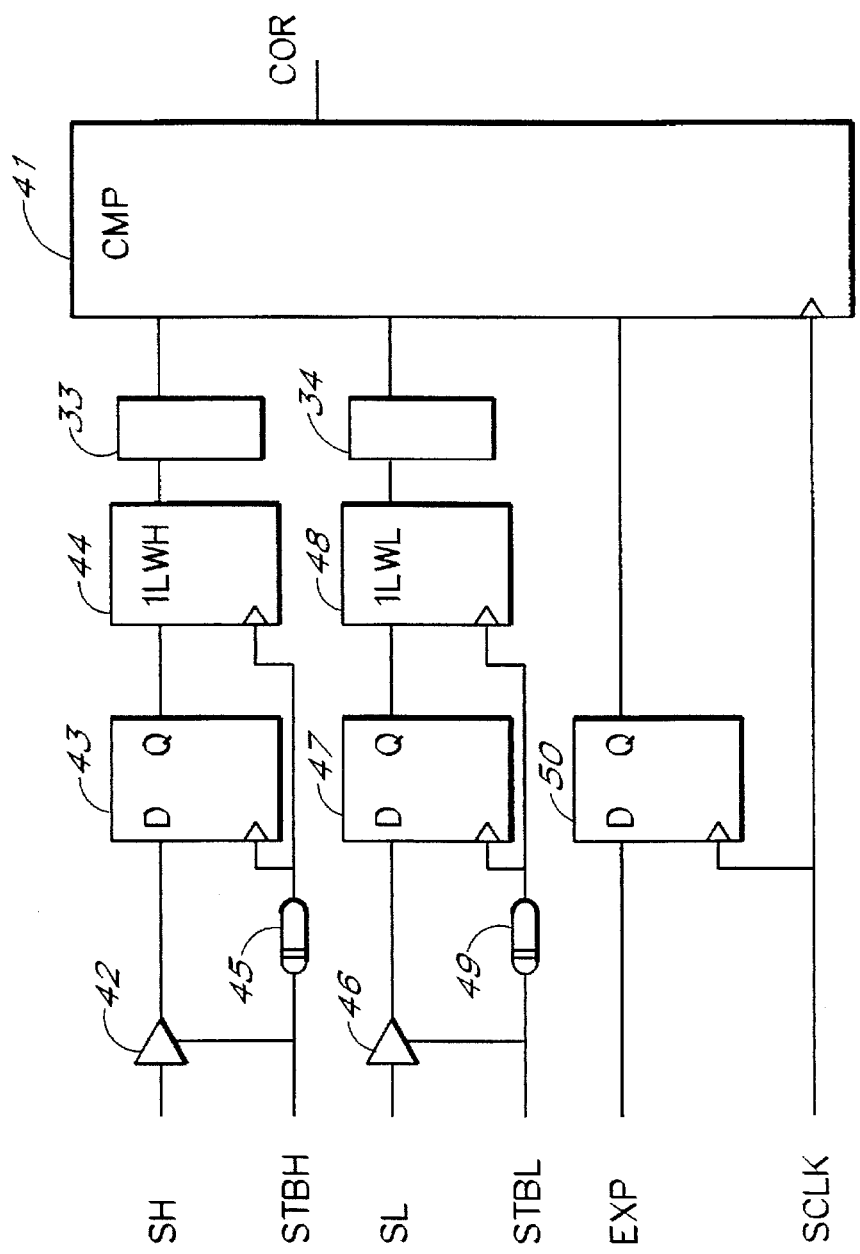
FIG. 5 shows an example of circuit configuration of the conventional digital comparison circuit.
Figure 8:
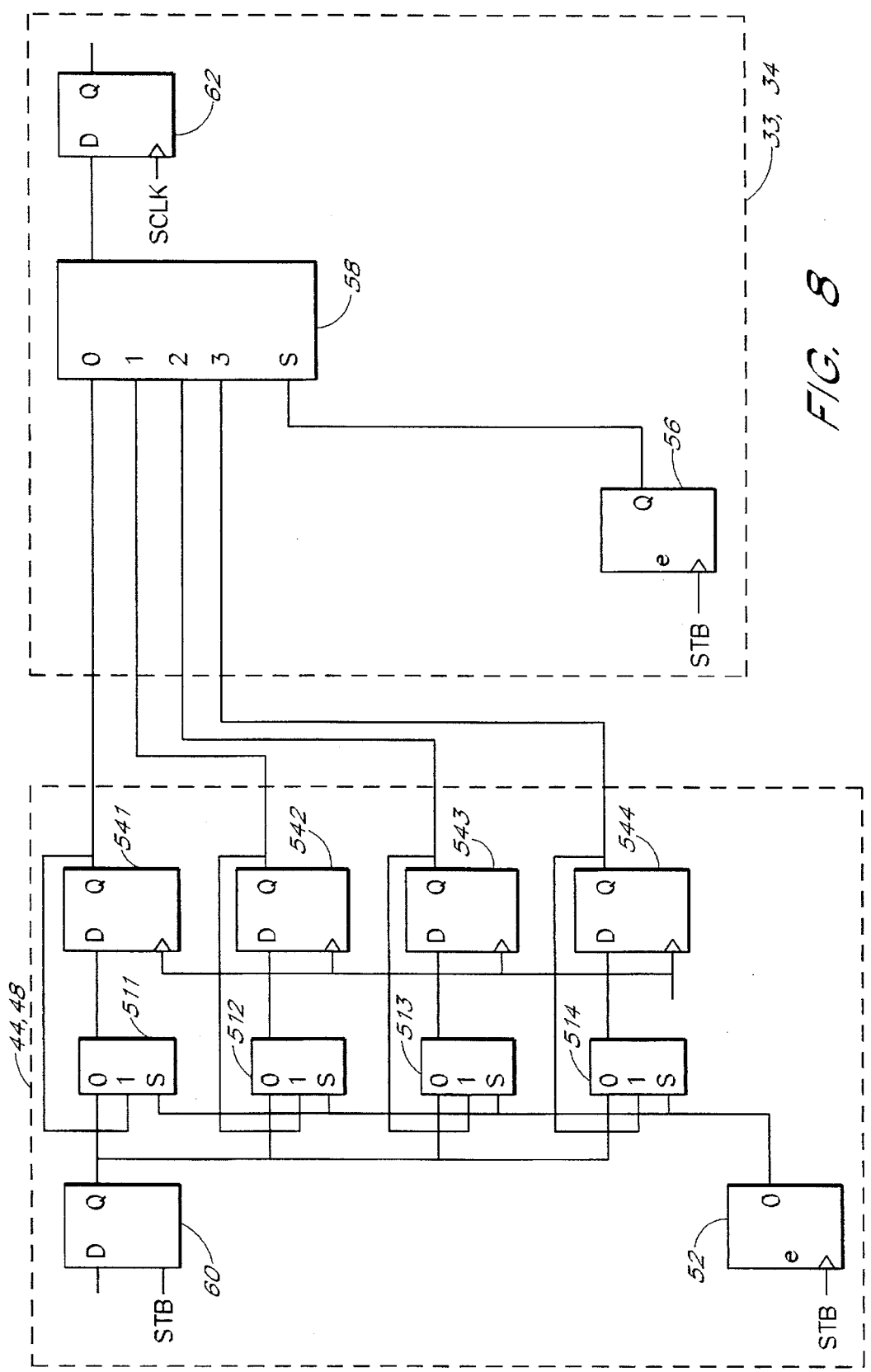
FIG. 8 is a circuit diagram showing an example of interleave circuit used in a comparison circuit.

FIG. 3 shows an example of circuit configuration of the digital comparison circuit 40 of the present invention. As shown in FIG. 3, the digital comparison circuit 40 includes interleave writing circuits 44 and 48, interleave reading circuits 403 and 404 both of which are substantially the same as shown in FIG. 8. The interleave writing circuits 44 and 48 are provided with the strobe signals while the interleave reading circuits 403 and 404 are provided with the system clock SCLK. The strobe open signals STBHO and STBHL are provided to enable terminals of the counters in the interleave reading circuits 403 and 404 through flip-flops 401 and 402. Flip-flops 405 and 406 transfer the strobe open signals to mask gates 408 and 409, respectively. The expected value signal is provided to the digital comparator 41 through flip-flops 50 and 407. The flip-flops 50, 401, 402, 405–407 are all synchronized with the system clock SCLK.

At the enable terminal of the counter in the interleave reading circuit 403, the high level strobe open signal STBHO is given through the flip-flop 401. Similarly, at the enable terminal of the counter in the interleave reading circuit 404, the low level strobe open signal STBLO is given through the flip-flop 402. The strobe open signals at the terminals make the corresponding counter in the interleave reading circuits hold (inhibit) its reading operation at the test cycle of the strobe open signal.

The mask gate 408 which is controlled by the strobe open signal from the flip-flop 405 is connected to the interleave reading circuit 403 so that the data from the interleave reading circuit 403 is prohibited from passing therethrough during the test cycle having the strobe open signal. Therefore, the comparison operation is not performed for the output data of the interleave circuit 403. Similarly, the mask gate 409 which is controlled by the strobe open signal from the flip-flop 406 is connected to the interleave reading circuit 404 so that the data from the interleave reading circuit 404 is prohibited during the test cycle having the strobe open signal. Therefore, the comparison operation is not performed for the output data of the interleave circuit 404. When the strobe open signals are not given, the logic comparison circuit 41 performs a logic comparison operation for the output signal of each mask gates 408 and 409 with the expected value EXP and outputs the comparison result COR.

FIG. 7 shows a timing chart involving the strove signals in the embodiment of the present invention. In FIGS. 7A and 7B, the expected value data and the output signal from the device under test are the same as in FIG. 6. When the strobe signal is unnecessary, the strobe signal is inhibited by the strobe open signal as describe above. Thus, the strobe signal does not appear at the part shown by the dotted line of FIGS. 7C and 7D. Therefore, the close limitation in this situation becomes the value of time interval THY between the existing adjacent strobe signals. And the testing apparatus can afford to set the strobe signal even at the highest operating rate of the testing apparatus.

As has been described, the present invention has significantly relaxed the problem involving the close limitation. Further, when a comparison is not required, the comparison circuit of the present invention generates the strobe open signal which inhibits the logic comparison circuit to perform the operation during the corresponding test cycle.

Accordingly, the present invention provides a comparison circuit to be used in a semiconductor testing apparatus which compares an output from a device under test with an expected value signal at a timing of strobe signal with larger margin and range in setting the timings of the strobe signal.

I claim:

1. A comparison circuit for a semiconductor testing apparatus which compares an output of a semiconductor device under test with an expected value signal, comprising:

an analog comparator for comparing said output of said semiconductor device under test with a predetermined reference voltage and temporarily holding the comparison result by a timing of a strobe signal;

an interleave writing circuit for receiving series data of said comparison result and storing said data in a parallel manner by a timing determined by said strobe signal;

an interleave reading circuit for reading said parallel stored data in said interleave writing circuit in a series manner by a timing of a system clock;

a logic comparator for comparing said data received from said interleave reading circuit and said expected value signal by a timing determined by said system clock;

a decoder for decoding said expected value signal and producing a strobe open signal, said strobe open signal being supplied to said interleave reading circuit to inhibit reading said data; and a mask gate for prohibiting an output of said interleave reading circuit from transmitting to said logic comparator when said strobe open signal is received from said decoder.

2. A comparison circuit for a semiconductor testing apparatus as defined in claim 1, wherein said strobe open signal is supplied to said interleave reading circuit and said mask gate in synchronism with said system clock.

3. A comparison circuit for a semiconductor testing apparatus as defined in claim 1, wherein said interleave reading circuit includes a counter which increments by said system clock and stops counting said system clock when said strobe open signal is supplied to an enable input.

4. A comparison circuit for a semiconductor testing apparatus as defined in claim 1, wherein said strobe signal supplied to said interleave writing circuit is delayed by a time determined by a delay element.

5. A comparison circuit for a semiconductor testing apparatus as defined in claim 1 further includes a selector for selectively providing said strobe open signal to said interleave reading circuit and said mask gate based on a mode signal.

6. A comparison circuit for a semiconductor testing apparatus which compares an output of a semiconductor device under test with an expected value signal, comprising:

- a pattern generator for generating a test pattern signal to be supplied to said semiconductor device under test, an expected value signal, a system clock, and a control signal;
- a timing generator for generating a strobe signal based on said control signal from said pattern generator;
- means for latching data representing said output of said semiconductor device under test by a timing of said strobe signal;
- an interleave writing circuit for receiving said latched data and storing said data in a parallel manner by a timing determined by said strobe signal;
- an interleave reading circuit for reading said parallel stored data in said interleave writing circuit in a series manner by a timing of said system clock;
- a logic comparator for comparing said data received from said interleave reading circuit and said expected value signal by a timing determined by said system clock;
- a decoder for decoding said expected value signal and producing a strobe open signal, said strobe open signal being supplied to said interleave reading circuit to inhibit reading said data; and
- a mask gate for prohibiting an output of said interleave reading circuit from transmitting to said logic comparator when said strobe open signal is received from said decoder.

7. A comparison circuit for a semiconductor testing apparatus as defined in claim 6, wherein said interleave reading circuit includes a counter which increments by said system clock and stops counting said system clock when said strobe open signal is supplied to an enable input of said counter.

8. A comparison circuit for a semiconductor testing apparatus as defined in claim 6 further includes a selector for selectively providing said strobe open signal to said interleave reading circuit and said mask gate based on a mode signal.

9. A comparison circuit for a semiconductor testing apparatus which compares an output of a semiconductor device under test with an expected value signal, comprising:

- a first analog comparator for comparing said output of said semiconductor device under test with a high level reference voltage and temporarily holding a first comparison result by a timing of a strobe signal;
- a second analog comparator for comparing said output of said semiconductor device under test with a low level reference voltage and temporarily holding a second comparison result by said timing of said strobe signal;
- a first interleave writing circuit for receiving series data of said first comparison result and storing said data in a parallel manner by a timing determined by said strobe signal;
- a second interleave writing circuit for receiving series data of said second comparison result and storing said data in a parallel manner by a timing determined by said strobe signal;
- a first interleave reading circuit for reading said parallel stored data in said first interleave writing circuit in a series manner by a timing of a system clock;
- a second interleave reading circuit for reading said parallel stored data in said second interleave writing circuit in a series manner by said timing of said system clock;
- a logic comparator for comparing said data received from said first and second interleave reading circuits and said expected value signal by a timing determined by said system clock;
- a decoder for decoding said expected value signal and producing strobe open signals, said strobe open signals being supplied to said first and second interleave reading circuits to inhibit reading said data; and
- a pair of mask gates for prohibiting outputs of said first and second interleave reading circuits from transmitting to said logic comparator when said strobe open signals are received from said decoder.

10. A comparison circuit for a semiconductor testing apparatus as defined in claim 9, wherein said first interleave reading circuit includes a first counter which increments by said system clock and stops counting said system clock when said strobe open signal is supplied thereto, and said second interleave reading circuit includes a second counter which increments by said system clock and stops counting said system clock when said strobe open signal is supplied thereto.

11. A comparison circuit for a semiconductor testing apparatus as defined in claim 9 further includes a selector for selectively providing said strobe open signals to said first and second interleave reading circuits and said pair of mask gates based on a mode signal.

* * * * *